United States Patent
Fan et al.

(10) Patent No.: US 7,583,151 B2
(45) Date of Patent: Sep. 1, 2009

(54) VCO AMPLITUDE CONTROL

(75) Inventors: Yongping Fan, Portland, OR (US); Ian Young, Portland, OR (US)

(73) Assignee: Intel Corporation, Santa Clara, CA (US)

(*) Notice: Subject to any disclaimer, the term of this patent is extended or adjusted under 35 U.S.C. 154(b) by 27 days.

(21) Appl. No.: 11/701,303

(22) Filed: Jan. 31, 2007

(65) Prior Publication Data

US 2008/0180185 A1    Jul. 31, 2008

(51) Int. Cl.
*H03L 5/00* (2006.01)
*H03B 5/08* (2006.01)

(52) U.S. Cl. .......................... 331/15; 331/167; 331/183

(58) Field of Classification Search .............. 331/15, 331/109, 167, 182, 183
See application file for complete search history.

(56) References Cited

U.S. PATENT DOCUMENTS

| | | | |
|---|---|---|---|
| 6,052,036 A | 4/2000 | Enstrom et al. | |
| 6,060,956 A | 5/2000 | Mole et al. | |
| 6,268,777 B1 | 7/2001 | Welch | |
| 6,344,778 B1* | 2/2002 | Nakamura et al. | 331/34 |
| 6,700,450 B2 | 3/2004 | Rogers | |
| 7,062,229 B2* | 6/2006 | Dunworth et al. | 455/76 |
| 7,236,059 B2* | 6/2007 | Stevenson et al. | 331/46 |
| 7,332,979 B2* | 2/2008 | Connell et al. | 331/183 |
| 2004/0203982 A1* | 10/2004 | Barak et al. | 455/522 |

OTHER PUBLICATIONS

International Search Report and Written Opinion for PCT application PCT/US2008/052488 mailed May 14, 2008.

* cited by examiner

*Primary Examiner*—Benny Lee
*Assistant Examiner*—Levi Gannon
(74) *Attorney, Agent, or Firm*—Erik R. Nordstrom

(57) ABSTRACT

Disclosed are circuits and methods to control the amplitude of a signal generated by a VCO.

12 Claims, 3 Drawing Sheets

VCO AMPLITUDE CONTROL

TECHNICAL FIELD

The present invention relates generally to circuits and methods for controlling the amplitude of a signal generated by a voltage controlled oscillator (VCO), e.g., in a phase locked loop (PLL) with an LC-type VCO.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Inductor-capacitor voltage controlled oscillators (LCVCOs) may be used in a wide variety of applications including within phase locked loop (PLL) circuits to generate phase and/or frequency controlled clocks. They may be especially desired in high-frequency, low power applications because they can have less jitter due to favorable thermal noise immunity and power supply noise rejection. Unfortunately, it can be challenging to manufacture LCVCOs in commercial volumes due, among other things, to deviations in tank (LC) Q factor, which makes it difficult to achieve consistent signal amplitudes from product to product, as a result of differences in process and temperature. Small changes in the Q factor can cause significant amplitude deviations, and in some cases, oscillations may not even start at all. Accordingly, embodiments for controlling (or calibrating) oscillation amplitude are disclosed herein.

Figure 1:
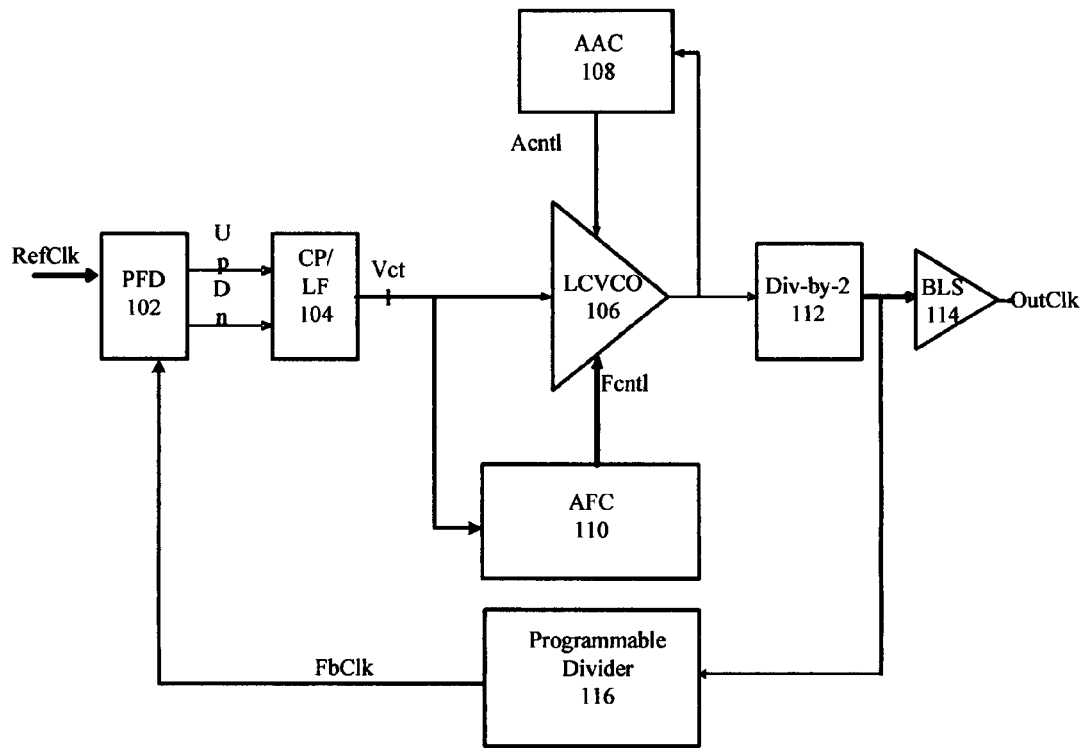
FIG. 1 is a diagram of a phase locked loop circuit in accordance with some embodiments.

FIG. 1 shows a PLL circuit using an LCVCO, in accordance with some embodiments. It generally comprises a phase-frequency detector (PFD) 102, a charge pump/loop filter (CP/LF) 104, an LC-type VCO 106 (with an automatic amplitude control circuit 108 and an automatic frequency control circuit 110), a divide-by-2 circuit 112, a buffer/level shifter (BLS) circuit 114, and a programmable divider 116, all coupled together as indicated. (Note that while single lines are used for convenience, the actual signals are not necessarily so limited. For example, they may comprise one or more lines, such as with differential signals or multi-bit digital signals.)

The PFD 102 receives a reference clock signal (RefClk) and generates from it a phase and/or frequency aligned version of the reference clock at the output (OutClk) of the BLS circuit 114. It receives a fedback version (FbClk) of the generated clock (tapped from the output of the Divide-by-2 circuit in this case) and compares its phase and/or frequency with that of the reference clock to generate an error signal reflecting the phase/frequency difference. In this case, the error signal comprises an Up signal that asserts if the reference clock is ahead of the fedback clock and a Dn signal that asserts if the fedback clock is ahead of the reference clock. An assertion of the Up or Dn signal charges or discharges the charge pump/loop filter 104 to appropriately raise or lower a VCO control voltage (Vctl). This causes the LCVCO 106 to increase or decrease the phase/frequency of its generated clock in order to adjust for the difference between the reference and fedback clocks.

The automatic frequency control circuit 110 is coupled to the LCVCO to control its frequency, while the automatic amplitude control circuit (AAC) 108 is coupled to the LCVCO to control the amplitude of its generated signal. (Note, for simplicity sake, external signals such as control signals to the AFC and AAC circuits are not shown but may be employed for adjustable control of parameters within either circuit. In addition, the AFC circuit may not be used in some embodiments, depending upon particular design considerations.) As discussed below, in accordance with some embodiments, the AAC circuit may be used at startup to control the LCVCO to generate a clock to have a desired "target" amplitude. Once reached, the amplitude control circuit 108 may be disengaged for steady state PLL operation in order to reduce jitter that could otherwise be caused by amplitude adjustments to the generated clock. This is not required however. In other embodiments, it may be sporadically or continually engaged, depending on design concerns and the operational environment.)

The clock signal generated by the LCVCO is fed into the divide-by-2 circuit, which produces a clock with half the frequency of that generated from the LCVCO. For various performance advantages, this (or similar approaches) may be desirable in order to force the LCVCO to operate at a higher frequency than the ultimately provided output clock frequency. From here, the generated clock is buffered and level shifted to make it suitable for use in a given application (e.g., clock tree source, communications link, etc.).

Figure 2:
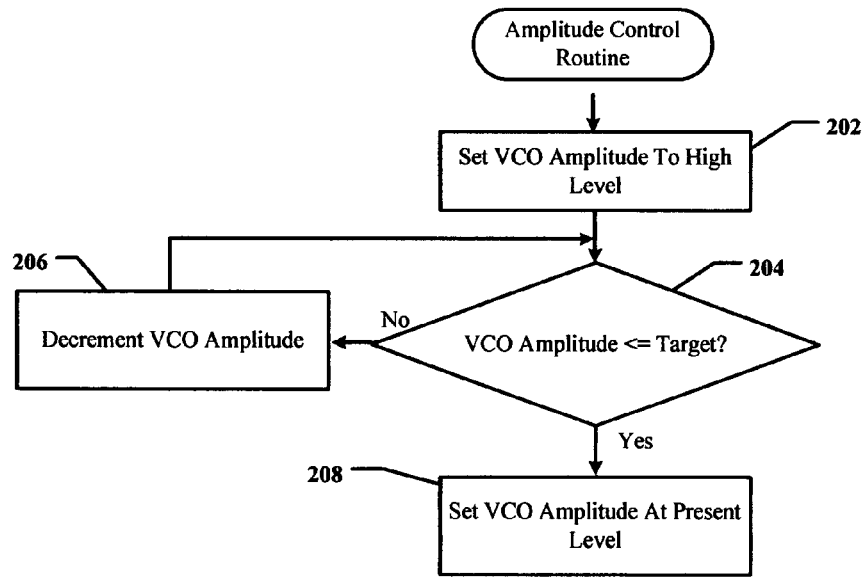
FIG. 2 is a flow diagram of a routine for controlling a VCO amplitude for the PLL of FIG. 1 in accordance with some embodiments.

FIG. 2 generally shows a routine to control the VCO amplitude with an amplitude control circuit (such as AAC circuit 108). Initially, at 202, the LCVCO signal amplitude is set (e.g., via an amplitude control signal, such as a current source bias signal). For example, it may be set to a maximum level to substantially ensure that the initial level is above a steady state target and also, to ensure that the oscillator starts up, even when "worst case" tank Q factors may be encountered. Next, at 204, it is determined if the measured VCO signal amplitude is less than or equal to the target level. If not, then the VCO signal amplitude is reduced (e.g., decremented) at 206, and the routine proceeds back to 204 to compare the new signal amplitude against the target.

This looping continues until the signal amplitude is, in fact, less than or equal to the target. Once this occurs, the routine proceeds to 208 where the VCO amplitude is set at its present level, and the routine is then typically suspended for steady state PLL operation.

Figure 3:
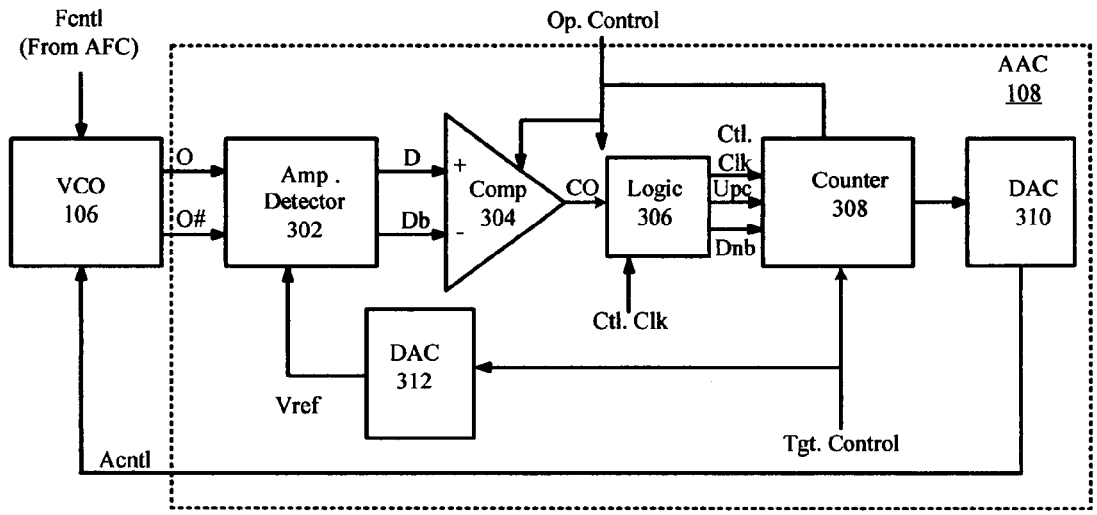
FIG. 3 is a diagram of an amplitude control circuit for the PLL of FIG. 1 in accordance with some embodiments.

FIG. 3 shows a more detailed implementation of a mixed signal, automatic amplitude control circuit 108, coupled to an LCVCO 106, in accordance with some embodiments. It comprises an amplitude detector 302, a comparator 304, logic circuit 306, a counter 308, a first D-to-A converter (DAC) 310 to control the VCO signal amplitude, and a second DAC 312 to control Vref (which establishes the target amplitude), all coupled together as shown. Operation control signals (Op. Control) are coupled to the comparator 304, logic circuit 306, and counter 308, to control (e.g., enable, reset, etc.) their operation. Similarly, a target control (Tgt. Control) signal is coupled to the Vref DAC 312 and counter 308 to set the target level through Vref. A control clock (Ctl. Clk) signal is provided to the logic 306, and passed to the counter 308, to clock the logic and counter and is typically less than the frequency of the generated VCO clock. For example, with a VCO clock in the range of 5 to 10 GHz, a control clock around 25 MHz. may be employed.

The VCO generates a differential clock signal, O/O#, that is coupled to amplitude detector 302 in the AAC circuit. The AAC circuit compares the level of the oscillating signal against the target amplitude and controls the LCVCO, in accordance therewith, using an applied amplitude control signal (Acntl). In the depicted embodiment, the magnitude of the oscillating signal is controlled by a current source internal to the VCO and thus, in this case, the Acntl signal corresponds to a voltage bias signal for controlling the current source in order to control the amplitude of the generated VCO signal.

The amplitude detector 302 receives the oscillating differential signal, O/O#, and compares its amplitude with an internal voltage (proportional to Vref) to generate differential, substantially DC, outputs, D and Db. D and Db reflect the relative magnitudes of Vref and O/O#, respectively. Since Vref corresponds to the target level, D and Db thereby provide relative magnitude relationship information for the actual signal and target signal amplitudes. That is, in the depicted embodiment, if D is greater than Db, then the VCO magnitude exceeds the target and conversely, if D is less than or equal to Db, then the signal amplitude is less than or equal to the target.

The target amplitude is set by Vref, which can be adjusted using the indicated target control (Tgt. Control) signal. For example, with 4-bit DACs and a 4-bit counter, scanable 4-bit registers may be used to implement the target control signal in order to set the target, as well as counter parameters.

The comparator 306 receives D and Db and compares their magnitudes. In the depicted embodiment, if D is greater than Db (indicating that the magnitude of the generated VCO signal is greater than the target), then the comparator output (CO) provides a logic high. Conversely, if Db is greater than D (indicating that the VCO signal magnitude is less than or equal to the target), then the comparator outputs a logical low.

The logic circuit 306 controls the counter to count up or down, depending, respectively, on whether the comparator output is high or low. In the depicted embodiment, the counter comprises a four bit up/down counter that is initially set to output all '0s when the AAC circuit is initiated. The logic circuit controls the counter to count up when D is greater than Db, indicating the generated clock magnitude is greater than the target. In the depicted embodiment, this causes the VCO DAC 410 (which is initially set at a maximal or otherwise high level) to output a lower voltage (Acntl). Since the Acntl voltage controls a current source in the VCO that is proportional to the magnitude of its generated signal, this results in the VCO signal amplitude decreasing.

On the other hand, once Db is greater or equal to D (indicating that the VCO oscillation magnitude is just below the target level), the comparator outputs a Low. This causes the logic 306 to control the counter 308 to count down (or back) an increment. In some embodiments, once this happens, the logic circuit 306 "freezes" the counter and essentially, locks the VCO DAC 310 output to maintain the VCO oscillation magnitude at its present level, which will typically be slightly above or less than the target (but sufficiently close to it) depending on particular logic circuit implementation.

Figure 4:
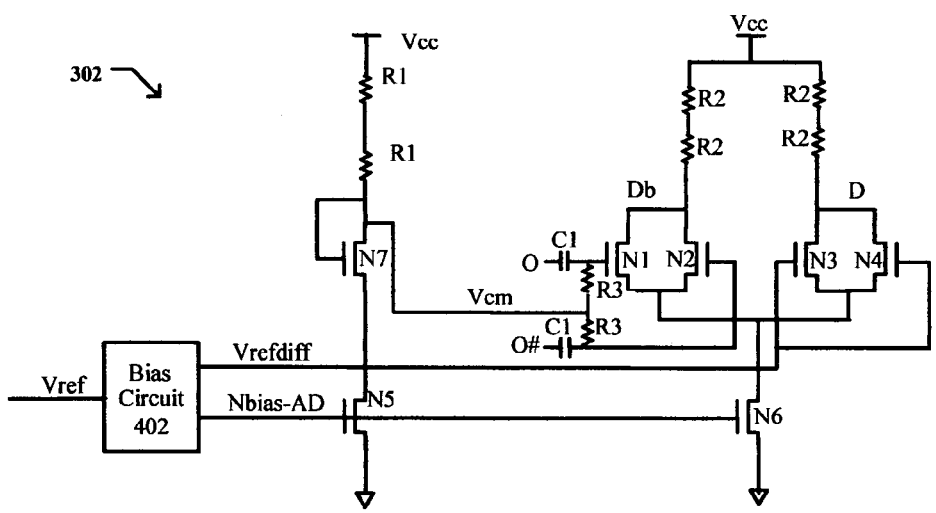
FIG. 4 is a diagram of an amplitude detection circuit, for the amplitude control circuit of FIG. 3, in accordance with some embodiments.

FIG. 4 shows a more detailed implementation of an amplitude detection circuit 302 in accordance with some embodiments. It generally comprises a bias circuit 402, resistors R1, R2, R3, NMOS transistors N1-N7, and capacitors C1, all coupled together as shown. Matched transistors N1-N4, transistor N6, and resistors R2 make up a differential amplifier with transistor N6 functioning as its common current source. A first (signal) side leg is formed from series coupled resistors R2, coupled to parallel-coupled transistors N1 and N2. The Db node (from DC magnitude nodes D/Db) is at the drains of N1 and N2, while VCO signal is AC-coupled to their gates through resistors R3 and capacitors C1. A common mode adjustment node Vcm is at the junction of resistors R1, as shown. In some embodiments, the level of Vcm is set to be just above the threshold ($V_T$) levels of the N transistors, N1-N4.

The other (reference) side leg is formed from series coupled resistors R2, coupled to parallel coupled transistors N3 and N4. The D node (from DC magnitude nodes D/Db) is at the drains of N3 and N4, while their inputs are coupled to a Vrefdiff bias signal, corresponding to Vref (the target magnitude), from the bias circuit 402. Vrefdiff corresponds to Vref adjusted for parameter variations, etc.

The differential amplifier serves to compare the magnitude of O/O# with that of Vrefdiff (target). If the magnitude of O/O# is greater than the target amplitude, then the first (signal) leg turns on harder and Db will be less than D. Conversely, if O/O# is smaller than the target amplitude, then the second (reference) leg turns on harder and Db will be greater than D. Accordingly, Vrefdiff should be at a value to drive N3 and N4 at levels such that when O/O# is above the target, Db is less than D and when it is below the target, Db is greater than D.

The bias circuit 402, resistors R1, and transistors N5 and N7 form a bias section to provide appropriate levels for Vrefdiff, Nbias-AD, and Vcm. bias circuit 402 may comprise circuitry known in the art to provide Vrefdiff and Nbias-AD compensated for variations in process, voltage, and temperature (PVT). Vrefdiff and Nbias are both generated based on Vref, where Vrefdiff=Vref+C, where C is a PVT dependent constant. Regarding the common mode voltage (Vcm), R1, N5 and N7 should be configured so that Vcm is at an appropriate value. As mentioned above, in some embodiments, it may be set to be close to or just above the threshold levels of the differential amplifier transistors.

Figure 5:
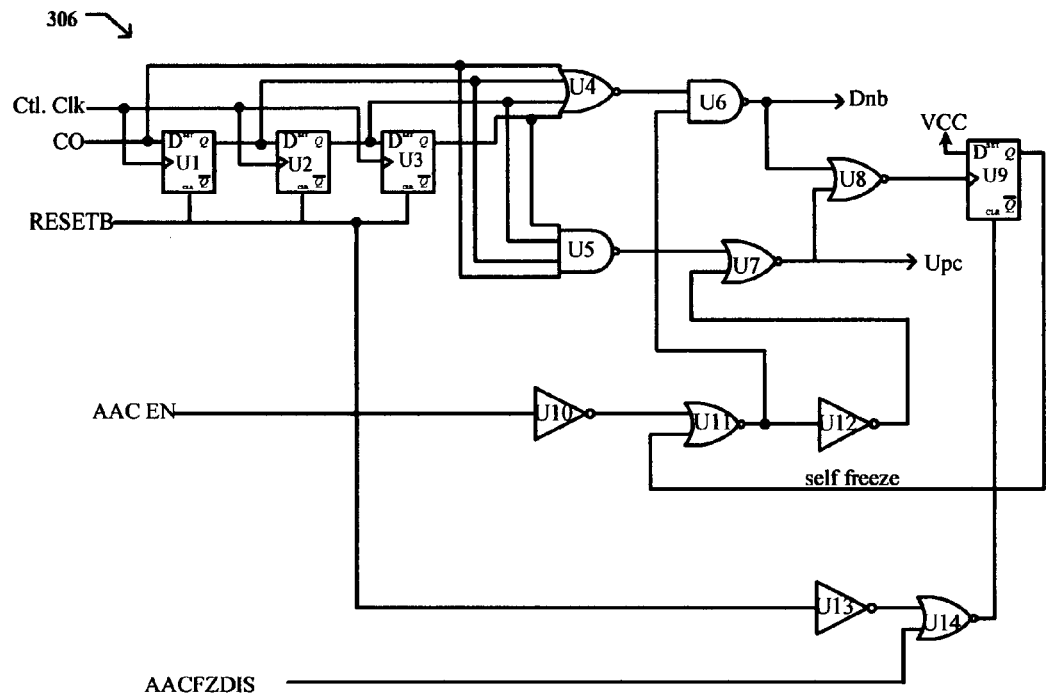
FIG. 5 is a diagram of a logic circuit to control a counter, for the amplitude control circuit of FIG. 3, in accordance with some embodiments.

FIG. 5 shows a logic circuit 306 in accordance with some embodiments. It generally comprises D-type flip flops: U1-U3, U9; NOR gates: U4, U7, U8, U11, U14; NAND gates: U5, U6; and inverters: U10, U12, U13, all coupled together as shown. the logic circuit stably controls up and down commands to the counter, and it provides a self-freeze function to de-activate adjustment of the VCO signal magnitude, once it is satisfactorily close to the target.

In the depicted embodiment, it has several input and output signals. A control clock (Ctl Clk) is coupled to drive flip-flops U1-U3. this is the same clock used for the counter. A reset signal (RESETB, active low) is also coupled to these flip-flops, as well as to flip-flop U9 through U13 and U14, to reset the flip-flops (low), e.g., at start-up. The output (CO) from the comparator determines whether the counter is to count up, down, not at all, or be in a self freeze mode. An ACC enable (ACC EN) is provided to enable (high) or disable (low) the circuit and stop the counter from counting. (Note that if AAC is disabled, the VCO amplitude can be set by the Tgt. Control signal.) An AAC freeze signal (AACFZDIS) is provided to disable the self freeze function when it is high.

In order to control the counter, the logic circuit provides an up command signal (Upc) and a down command signal (Dnb). When both the Upc and Dnb signals are high, the counter counts up. Conversely, when both signals are low, it counts down. When one signal is low and the other is high, it neither counts upward or downward and remains at its last count (e.g., when Upc is low and Dnb is high, then there is no change).

The output (CO) from the comparator is coupled to the inputs of U1, NOR gate U4, and NAND gate U5. As mentioned above, when CO is high, the counter is to count up and when it is low, the counter is to count down. When CO goes high (e.g., upon start-up when the signal magnitude is greater than the target), Dnb goes High. This also causes the clock input of D flip-flop U9 to be low. If ACC enable (ACC EN) is asserted (high), and the CO stays high, then after three clock cycles, U5 goes low, which causes Upc to go high. With Dnb already high, this causes the counter to count upward (e.g., from its starting state of all 0s).

When the CO signal goes low, the Upc signal goes low. When the CO signal has been low for three consecutive clock cycles, Dnb also then goes Low. This causes the counter to count down one step. Note that for the counter to count up or down, the CO signal must be consistent for three consecutive clock cycles because the change doesn't occur until it is clocked to the output of U3. This serves as a "filter" to filter out noise at the CO. for example, when D is close to Db, noise in the comparator may cause the output to "bounce." This noise, however, should not errantly affect the counter since a state must be at CO for three consecutive cycles to affect the Upc and Dnb signals.

If the (AACFZDIS) signal is de-asserted (low), on the clock cycle after Upc and Dnb are low, the output of U8 goes high, which clocks a high through to the output of U9 (self freeze). This causes the output of U11 to go high, which causes Dnb to go high and Upc to go low. This "freezes" the counter, as well as U9, to maintain the counter in this state until the circuit is reset. This feature may be desirable, especially in jitter sensitive PLL applications because the ACC does not change the VCO magnitude after self freeze activates, which may reduce jitter in the PLL.

Operation of the circuit in accordance with some embodiments will now briefly be described. Before startup, each flip-flop (and the counter) are reset to low. This corresponds to maximum VCO signal amplitude for "quick" startup. Since the amplitude will (or typically will) be higher than the target, Upc will be high and Dnb will be high. The counter will move up, bit by bit, until the signal amplitude is slightly lower than the target. When the amplitude is lower than the target, Upc goes to low, and the counter stops counting up. If the comparator output stays low for three consecutive clock cycles, Dnb goes from high to low, which triggers a sticky 1 on the self freeze output (U9 out). This sets Upc to low and Dnb to high, which causes the counter to remain at a desired value. Note that in a case where the initial maximum amplitude is lower than the target (this may happen when the target is set very high or if tank Q for a given chip is much lower than expected), the control loop will keep the counter at 0 and the LCVCO outputs the maximum amplitude.

Figure 6:
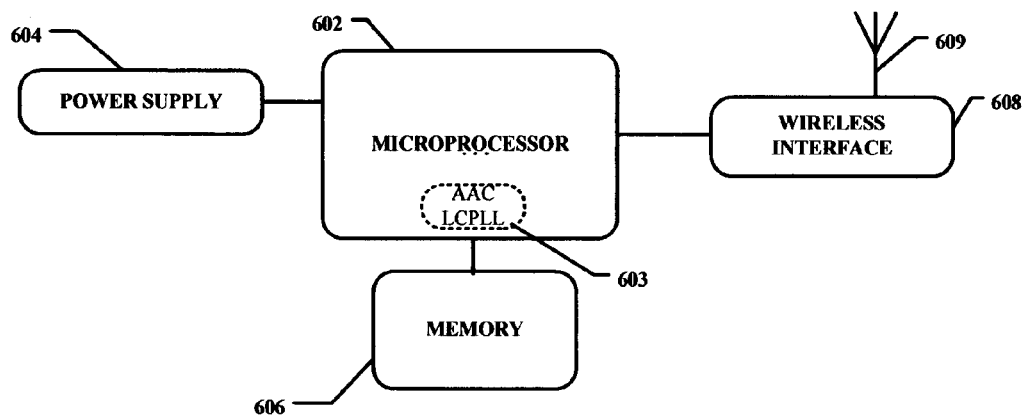
FIG. 6 is a diagram of a computer system having a link with at least one LC type PLL in accordance with some embodiments disclosed herein.

With reference to FIG. 6, one example of a computer system is shown. The depicted system generally comprises a processor 602 that is coupled to a power supply 604, a wireless interface 608, and memory 606. It is coupled to the power supply 604 to receive from it power when in operation. The wireless interface 608 is coupled to an antenna 609 to communicatively link the processor through the wireless interface chip 608 to a wireless network (not shown). Microprocessor 602 comprises one or more amplitude controlled LC-type VCO circuits 603. For example, it may comprise a PLL with such circuitry to implement a communications link with memory 606.

It should be noted that the depicted system could be implemented in different forms. That is, it could be implemented in a single chip module, a circuit board, or a chassis having multiple circuit boards. Similarly, it could constitute one or more complete computers or alternatively, it could constitute a component useful within a computing system.

The invention is not limited to the embodiments described, but can be practiced with modification and alteration within the spirit and scope of the appended claims. For example, it should be appreciated that the present invention is applicable for use with all types of semiconductor integrated circuit ("IC") chips. Examples of these IC chips include but are not limited to processors, controllers, chip set components, programmable logic arrays (PLA), memory chips, network chips, and the like.

Moreover, it should be appreciated that example sizes/ models/values/ranges may have been given, although the present invention is not limited to the same. As manufacturing techniques (e.g., photolithography) mature over time, it is expected that devices of smaller size could be manufactured. In addition, well known power/ground connections to IC chips and other components may or may not be shown within the FIGS. for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details. The description is thus to be regarded as illustrative instead of limiting.

What is claimed is:

1. A chip, comprising:
a VCO to generate an oscillatory signal with an amplitude; and
an amplitude control circuit to control the signal amplitude, said circuit to compare the signal amplitude against a target amplitude and adjust the signal amplitude to be sufficiently close to the target amplitude, wherein the amplitude control circuit comprises a counter to control the VCO signal amplitude and a logic circuit to control the counter in response to the relative size of the signal amplitude compared with the target amplitude, and wherein the logic circuit comprises filter circuitry to filter out noise from a comparison signal indicating the comparison between the relative sizes of the signal and target amplitudes.

2. The chip of claim 1, in which the amplitude control circuit comprises an amplitude detector circuit to generate one or more substantially DC signals having amplitudes corresponding to the amplitudes of the VCO signal and the target.

3. The chip of claim 2, in which the amplitude detector circuit comprises a differential amplifier having a signal leg with current corresponding to the signal magnitude and a reference leg with current corresponding to the target amplitude.

4. The chip of claim 3 in which the signal leg comprises at least one transistor with an input coupled to the VCO signal.

5. The chip of claim 4, in which the VCO signal is differential, and the amplitude detector signal leg comprises first and second parallel coupled transistors with inputs coupled to the differential VCO signal.

6. The chip of claim 1, in which the amplitude control circuit comprises a self freeze feature to suspend controlling the signal amplitude once it is sufficiently close to the target amplitude.

7. The chip of claim 1, in which the filter circuitry comprises one or more cascaded flip-flops coupled between the comparison signal and counter control signals to control counting of the counter.

8. The chip of claim 7, in which the logic circuit comprises self freeze circuitry to stop the counter from counting and hold its value when the signal amplitude is sufficiently close to the target amplitude.

9. The chip of claim 1, in which the VCO is an LC type VCO.

10. A computer system, comprising:

a processor having one or more PLL circuits each with a VCO to generate an oscillatory signal with an amplitude and an amplitude control circuit to control the signal amplitude, said circuit to compare the signal amplitude against a target amplitude and adjust the signal amplitude to be sufficiently close to the target amplitude, wherein the amplitude control circuit comprises a counter to control the VCO signal amplitude and a logic circuit to control the counter in response to the relative size of the signal amplitude compared with the target amplitude, and wherein the logic circuit comprises filter circuitry to filter out noise from a comparison signal indicating the comparison between the relative sizes of the signal and target amplitudes; and an antenna coupled to the processor.

11. The system of claim 10, in which the amplitude control circuit comprises an amplitude detector circuit to generate one or more substantially DC signals having amplitudes corresponding to the amplitudes of the VCO signal and the target.

12. The system of claim 10, in which the amplitude control circuit comprises a self freeze feature to suspend controlling the signal amplitude once it is sufficiently close to the target amplitude.

* * * * *